(12) United States Patent
Kim

(10) Patent No.: US 7,132,346 B2
(45) Date of Patent: Nov. 7, 2006

(54) ATOMIC LAYER DEPOSITION OF TITANIUM USING BATCH TYPE CHAMBER AND METHOD FOR FABRICATING CAPACITOR BY USING THE SAME

(75) Inventor: Yong-Soo Kim, Kyoungki-do (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 147 days.

(21) Appl. No.: 10/615,038

(22) Filed: Jul. 8, 2003

(65) Prior Publication Data
US 2004/0014295 A1  Jan. 22, 2004

(30) Foreign Application Priority Data
Jul. 19, 2002  (KR) .................. 10-2002-0042296

(51) Int. Cl.
*H01L 21/20* (2006.01)
(52) U.S. Cl. .................. 438/399; 438/395; 438/775
(58) Field of Classification Search ................ 438/778, 438/775, 785, 396, 399
See application file for complete search history.

(56) References Cited
U.S. PATENT DOCUMENTS

| | | | |
|---|---|---|---|
| 6,489,214 B1 | 12/2002 | Kim et al. | |
| 6,518,634 B1 | 2/2003 | Kaushik et al. | |
| 6,551,399 B1* | 4/2003 | Sneh et al. ................ | 117/102 |
| 6,551,873 B1 | 4/2003 | Park et al. | |
| 6,551,893 B1 | 4/2003 | Zheng et al. | |
| 6,573,547 B1 | 6/2003 | Ahn et al. | |
| 2003/0003649 A1* | 1/2003 | Park et al. ................. | 438/239 |
| 2004/0033661 A1* | 2/2004 | Yao et al. .................. | 438/253 |

* cited by examiner

*Primary Examiner*—Bradley K. Smith
(74) *Attorney, Agent, or Firm*—Marshall, Gerstein & Borun LLP (57) ABSTRACT

The present invention relates to a method for fabricating a capacitor employing ALD-TiN as an upper electrode and being suitable for preventing a deterioration of a leakage current property which uses an ALD-TiN as an upper electrode. The method for fabricating the capacitor includes: forming a lower electrode on a semiconductor substrate; forming a dielectric layer on the lower electrode; loading the semiconductor substrate containing the dielectric layer into a deposition chamber; nitriding a surface of the dielectric layer while $NH_3$ gas is flowed into the deposition chamber; and forming an upper layer by using a source gas $NH_3$, containing Titanium (Ti) on the nitrated surface of the dielectric layer through an atomic layer deposition (ALD) method.

3 Claims, 10 Drawing Sheets

ATOMIC LAYER DEPOSITION OF TITANIUM USING BATCH TYPE CHAMBER AND METHOD FOR FABRICATING CAPACITOR BY USING THE SAME

TECHNICAL FIELD

A method for fabricating a semiconductor device is disclosed; and more particularly, to a method for fabricating a capacitor by using an atomic layer deposition (ALD) technique is disclosed.

DESCRIPTION OF THE RELATED ART

Generally, a sputtering method, a chemical vapor deposition (CVD) method, or an atomic layer deposition (ALD) method is used for uniformly depositing a film during a fabrication of a semiconductor device.

In the sputtering method, an inert gas such as argon (Ar) is injected into a vacuum chamber while a high voltage for generating argon ions is applied to a target. The argon ions are sputtered on a surface of the target, and atoms of the target are removed from its surface.

A film having a property of superior adherence to a substrate and high purity can be formed by the above-mentioned sputtering method. However, in case of forming a large scale integration (LSI) film having a processing difference, it is difficult to obtain the uniform film. Therefore, the sputtering method is not suitable for forming a fine pattern.

Next, the CVD method is most widely used for depositing materials. A film having a required thickness is deposited on a substrate by using a reaction and dissolution gas. In the CVD process, various gases are injected into a reaction chamber, and the film having the required thickness is deposited by inducing a chemical reaction of the gases, wherein the chemical reaction is induced by a high energy such as heat, light, or plasma.

More particularly, for the CVD method, a deposition rate is increased by controlling a reaction condition which is controlled by a ratio and an amount of the injected gases as well as the plasma corresponding to the reaction energy.

However, the reaction induced by the CVD method proceeds very rapidly. Therefore, it is difficult to control a thermodynamic stability of atoms, and a physical and chemical property is deteriorated.

Also, the mentioned ALD method is suggested as a method for depositing a film in an atomic layer unit by supplying a source and a purge gas alternately. The film formed by the ALD method has the following advantages: a high aspect ratio; a superior uniformity even at a low pressure; and a good electrical and physical property.

Recently, an ALD method using a surface reaction is used to overcome a step coverage limit because it is not easy to overcome the step coverage limit when the conventional CVD method is applied to a structure having a high aspect ratio.

Figure 1A:
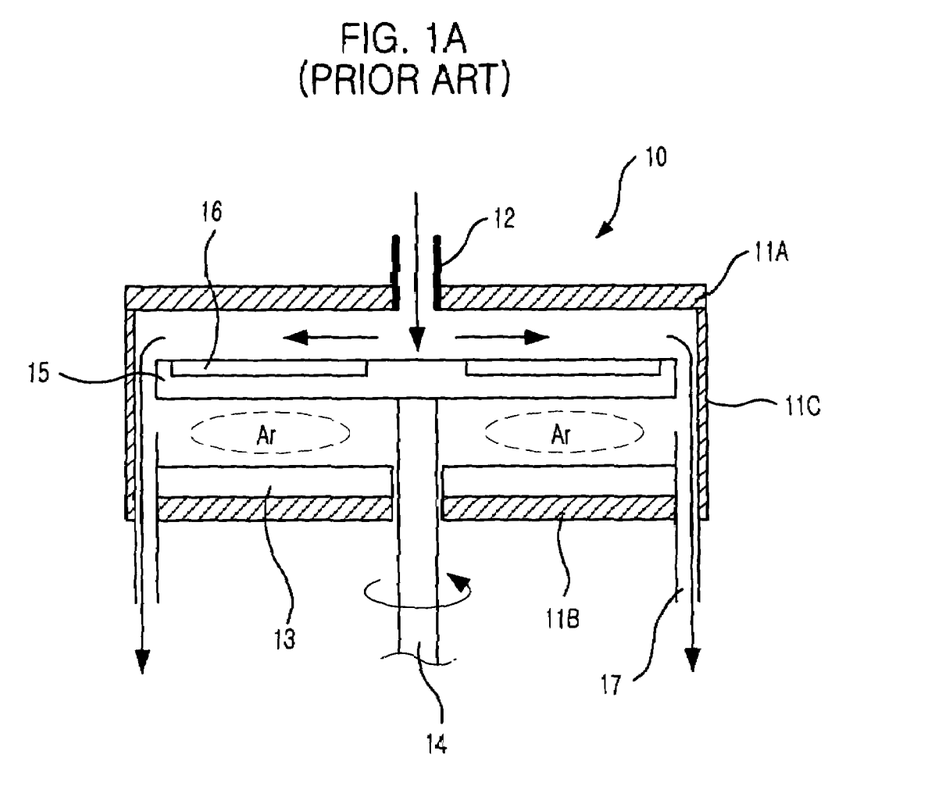
FIG. 1A is a cross sectional view illustrating a conventional batch type atomic layer deposition (ALD) equipment.
Figure 1B:
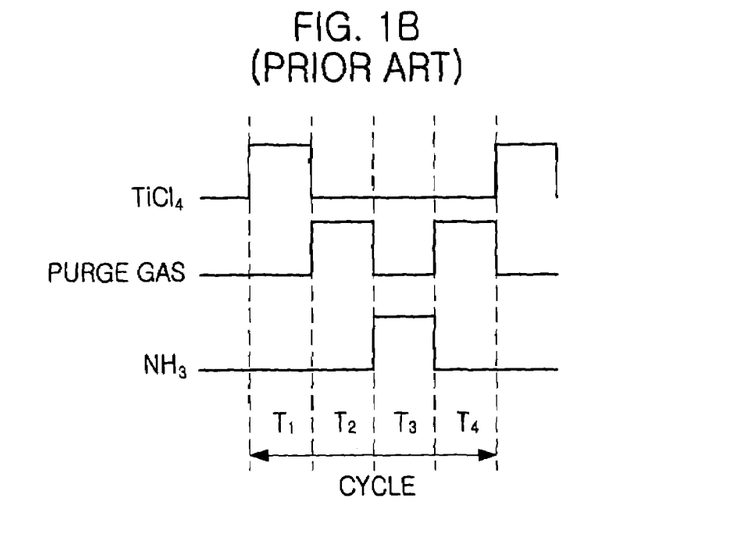
FIG. 1B is a gas supply timing diagram for depositing a TiN film by using a chamber of the batch type ALD equipment.

FIG. 1A shows a chamber of a batch type ALD equipment which is applied for a patent by the present applicant. FIG. 1B shows a gas supply timing, wherein the chamber shown in FIG. 1A is used for depositing a TiN film.

As shown, the batch typed ALD equipment contains: a reaction chamber including a sidewall 11C, an upper plate 11A, and a lower plate 11B; a shower head 12 injecting a source gas, a reaction gas, and a purge gas which penetrate a center of the upper plate 11A of the reaction chamber; a heating plate 13 capable of controlling a temperature of any area on a wafer and stuck on the lower plate 11B; a rotating axis 14 penetrating both of the lower plate 11B and heating plate 13; a rotating plate 15 fixed at bottom side of the center of the rotating axis, wherein a plurality of wafers are loaded at equal distances from the center; and an exhaust 17 for exhausting gases flowed from the shower head 12 having a baffle structure.

The batch type ALD equipment shown in FIG. 1A adopts a principle of a traveling wave in order to deposit an atomic layer.

Referring to FIG. 1B, during a period $T_1$, a chemical absorption of the source gas $TiCL_4$ occurs after the wafers are loaded and the source gas $TiCl_4$ is injected in the chamber. Another period $T_2$ is for a process in which the purge gas such as Ar is injected and the remnant $TiCl_4$ gas is exhausted. A period $T_3$ is for a process in which a reaction gas $NH_3$ is injected in order to induce a surface reaction with the chemically absorbed $TiCl_4$ on the wafer, thereby a TiN atomic layer is deposited. During a period $T_4$, the remnant reaction gas and a by-product from the reaction are exhausted. A cycle of $T_1$ to $T_4$ is repeatedly carried out in order to obtain the atomic layer with an intended thickness.

The atomic layer deposition of the TiN film as mentioned above is performed through a surface self limited reaction mechanism (SSLRM). A conformal and uniform film can be formed by the SSLRM. In addition, compared to the conventional CVD method, a particle generation caused by a gas phase reaction is suppressed because the source gas and the reaction gas are separately injected.

Figure 2:
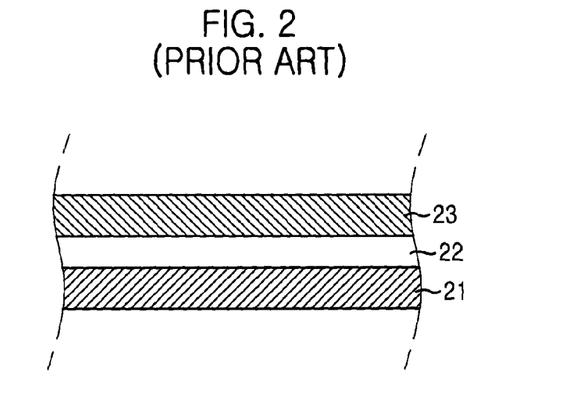
FIG. 2 is a cross-sectional view of a conventional MIS capacitor.

FIG. 2 shows a conventional structure of a metal insulator semiconductor (MIS) capacitor. A TaO dielectric layer 22 is formed on a doped poly-silicon layer 21 used for a lower electrode and an ALD-TiN layer 23 is formed on the TaO dielectric layer 22.

Figure 3A:
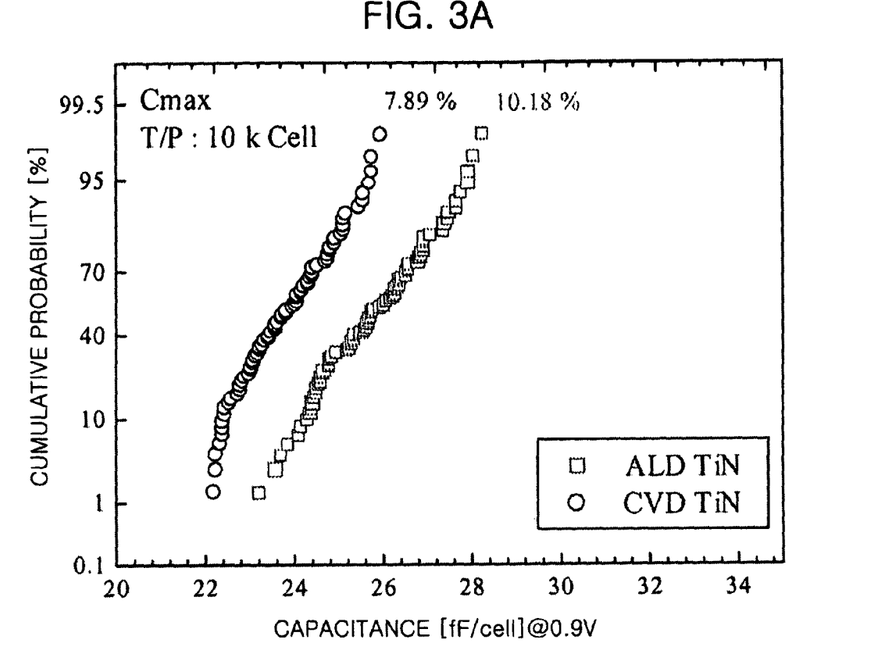
FIG. 3A is a graph of a relationship between a cell capacitance value and another capacitance value, each being obtained through a separate case that each of a CVD-TiN and a ALD-TiN is used as the MIS capacitor and a positive bias is applied to an upper electrode.
Figure 3B:
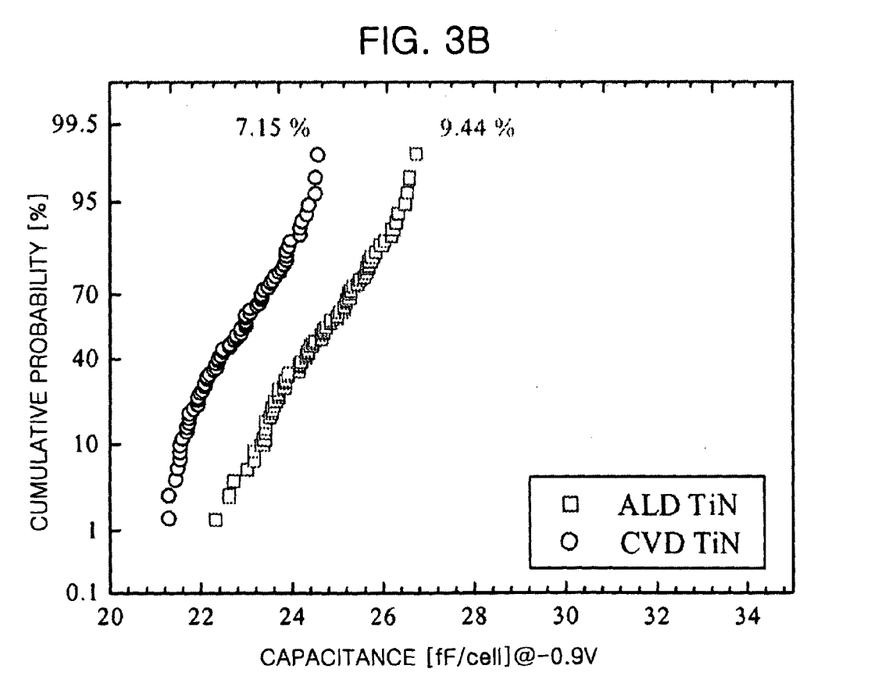
FIG. 3B is a graph showing between a cell capacitance value and another capacitance value, each being obtained through a separate case that each of the CVD-TiN and the ALD-TiN is used as the MIS capacitor and a negative bias is applied to the upper electrode.

FIGS. 3A and 3B are graphs illustrating a relationship between a capacitance and a cumulative probability related to a cell capacitor formed when a CVD-TiN and an ALD-TiN is used as an upper electrode of the capacitor. Especially, FIG. 3A shows a result for applying a positive bias to an upper electrode and FIG. 3B shows a result for applying a negative bias to the upper electrode. In addition, the capacitors according to the above mentioned cases have a thickness of 80 Å.

According to FIGS. 3A and 3B, in a case that the CVD-TiN is used as the upper electrode, the capacitance $(C_s)$ values are approximately 23.9±1.06 fF/cell and 22.9±0.94 fF/cell on conditions that the positive bias and the negative bias are applied to the upper electrode, respectively. In another case that the ALD-TiN is used as the upper electrode, the capacitance $(C_s)$ values are approximately 25.8±1.26 fF/cell and 24.7±1.10 fF/cell on conditions that the positive bias and the negative bias are applied to the upper electrode, respectively.

In conclusion, the cell capacitance value is improved by 2 fF/cell when the ALD-TiN is used for the upper electrode. This improvement means that a height of a capacitor recently being used can be reduced by 1300 Å, wherein the recently used capacitor has a thickness of 15500 Å.

However, a leakage current property of the capacitor using the ALD-TiN as the upper electrode is inferior to that of the capacitor using the CVD-TiN.

Figure 4A:
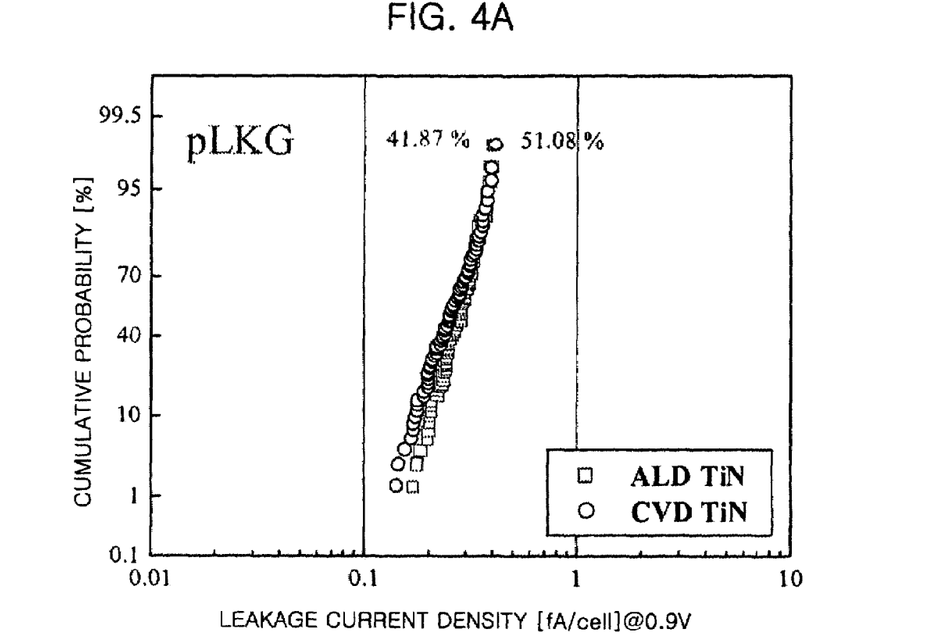
FIG. 4A is a graph explaining a relationship between a leakage current density values, each being obtained through a separate case that each of the CVD-TiN and the ALD-TiN is used as the MIS capacitor and a positive bias is applied to the upper electrode.
Figure 4B:
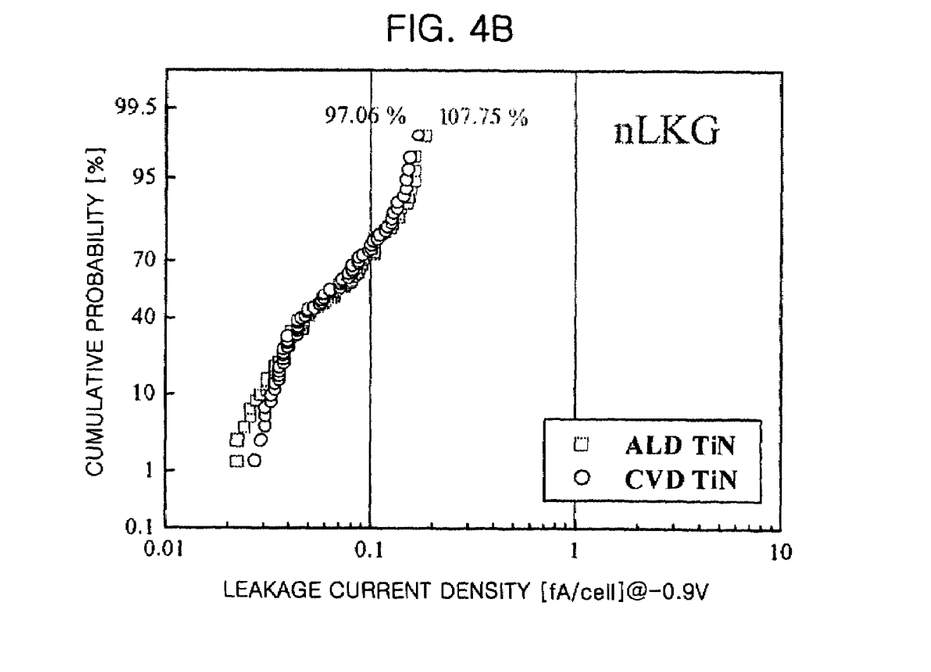
FIG. 4B is a graph demonstrating a relationship between a leakage current density values, each being obtained through a separate case that each of the CVD-TiN and the ALD-TiN is used as the MIS capacitor and a negative bias is applied to the upper electrode.

FIGS. 4A and 4B show a comparison of a leakage current density of the capacitor using the CVD-TiN with that of another capacitor using the ALD-TiN. FIG. 4A shows a result of a measurement when a positive bias is applied to the upper electrode and FIG. 4B shows another result of a measurement when a negative bias is applied to the upper electrode.

Accordingly, it is known that the leakage current property of the capacitor using the ALD-TiN is not improved compared with the capacitor using the CVD-TiN. The above-mentioned result is because of a fact that a $TiCl_4$ source gas of the ALD-TiN used as the upper electrode gives damages to a dielectric layer.

A $TiCl_4/NH_3$ exposure, that is, if a value which is obtained by multiplying a feeding time by a flow rate of a source gas and a reaction gas is more than a critical value, a deposition rate becomes saturated because the ALD method adopts a surface self saturation (SSS) property. The batch typed ALD equipment has a constant deposition rate of about 0.35 Å.

However, considering that a thickness of one monolayer of the ALD-TiN is about 2 Å, only 30% of a surface area is covered in terms of a surface coverage after a lapse of one cycle. As the cycle repeats, the dielectric layer is further exposed by the $TiCl_4$, and the leakage current property of the capacitor is deteriorated.

SUMMARY OF THE DISCLOSURE

A method for fabricating a capacitor is disclosed that employs ALD-TiN as an upper electrode which is effective for preventing deterioration of the leakage current property.

A disclosed method for fabricating a capacitor, including the steps of forming a lower electrode on a semiconductor substrate; forming a dielectric layer on the lower electrode; loading the semiconductor substrate containing the dielectric layer into a deposition chamber; nitriding a surface of the dielectric layer while $NH_3$ gas is flowed into the deposition chamber; and forming an upper layer by using a source gas $NH_3$, containing Titanium (Ti) on the nitrated surface of the dielectric layer through an atomic layer deposition (ALD) method.

BRIEF DESCRIPTION OF THE DRAWINGS

Other aspects and features of the disclosed methods will become apparent from the following description of the preferred embodiments with reference to the accompanying drawings, wherein.

DETAILED DESCRIPTION OF THE PREFERRED EMBODIMENTS

Hereinafter, a method for improving a poor leakage current property of a capacitor having an ALD-TiN layer is disclosed and compared to another capacitor having a CVD-TiN layer.

Figure 5:
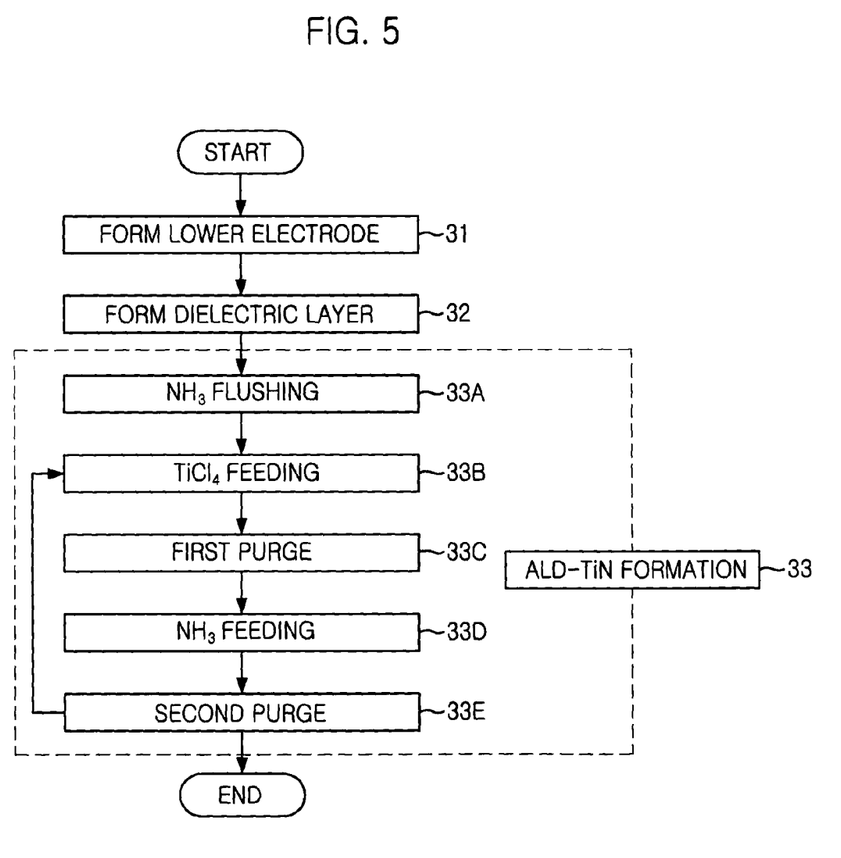
FIG. 5 is a flowchart explaining each step of a method for fabricating a capacitor in accordance with a first preferred embodiment of the present invention.

FIG. 5 is a flowchart illustrating each step of a method for fabricating a capacitor according to a first preferred embodiment.

As shown in FIG. 5, a lower electrode formation process 31, and a dielectric layer formation process 32 are carried out. Continuously, an ALD-TiN layer formation process 33 comprising a $NH_3$ flushing process 33A, TiCl4 feeding process 33B, the first purge process 33C, a $NH_3$ feeding process 33D, and the second purge process 33E are performed, wherein one cycle consists of the $TiCl_4$ feeding process 33B, the first purge process 33C, the $NH_3$ feeding process 33D, and the second purge process 33E.

As illustrated in FIG. 5, during the ALD-TiN layer formation process 33, a surface of the dielectric layer is nitrided by performing the $NH_3$ flushing process 33A in advance before the ALD-TiN layer formation is carried out.

Here, the $NH_3$ flushing process 33A includes the following steps: a wafer containing the formed dielectric layer is loaded into a batch type atomic layer deposition (ALD) equipment shown in FIG. 1A; and the $NH_3$ gas gets flown in at a flow rate of about 300 sccm to about 1000 sccm for about 10 to about 120 seconds after a sufficient preheating time.

Furthermore, the formed dielectric layer is not exposed by the source gas $TiCl_4$ because the dielectric layer is nitrided by performing the above flushing process before the cycle of the ALD-TiN atomic layer deposition process is initiated.

Figure 6A:
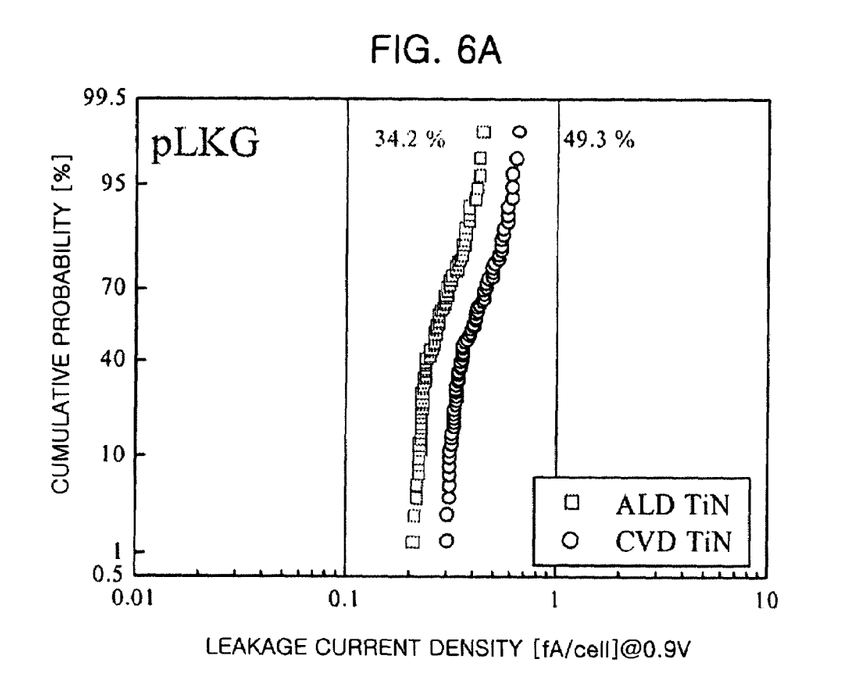
FIG. 6A is a graph showing a relationship between a cumulative probability and a leakage current density obtained through an applied positive bias.
Figure 6B:
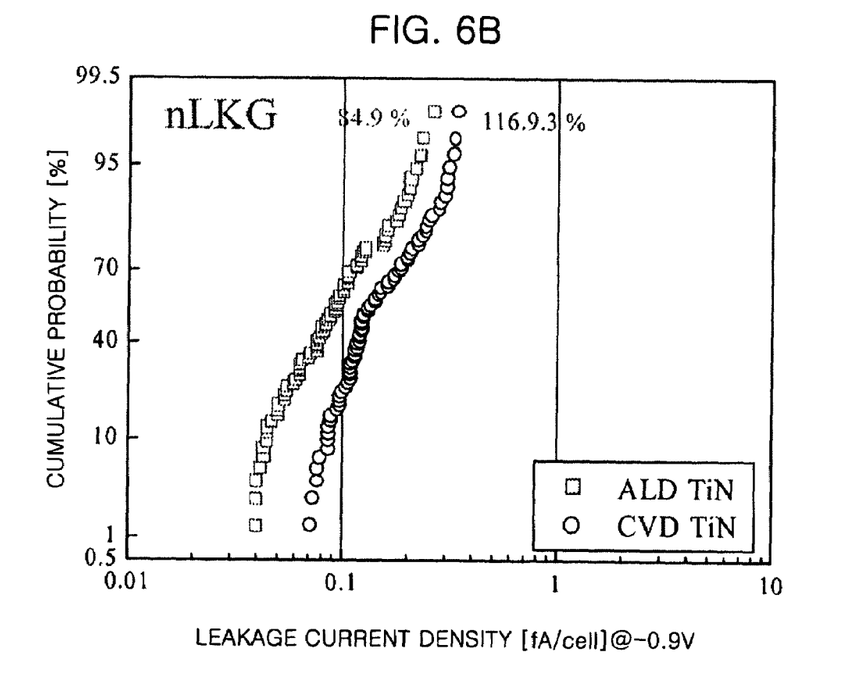
FIG. 6B is a graph showing a relationship between a cumulative probability and a leakage current density obtained through an applied negative bias.

FIGS. 6A and 6B are graph illustrating a relationship between leakage current density value and current density value, each being obtained through a separate case that each of a positive bias and a negative value is applied.

Here, the capacitor using the ALD-TiN as the upper layer goes through the NH$_3$ flushing process which is carried out at a flow rate of about 500 sccm for about 60 seconds before performing the ALD-TiN layer formation.

According to FIGS. 6A and, 6B, it is known that the leakage current density value of the capacitor using the ALD-TiN layer as the upper electrode is higher than that of the another capacitor using the CVD-TiN layer as the upper electrode in both cases that a positive bias and a negative bias are applied.

Figure 7:
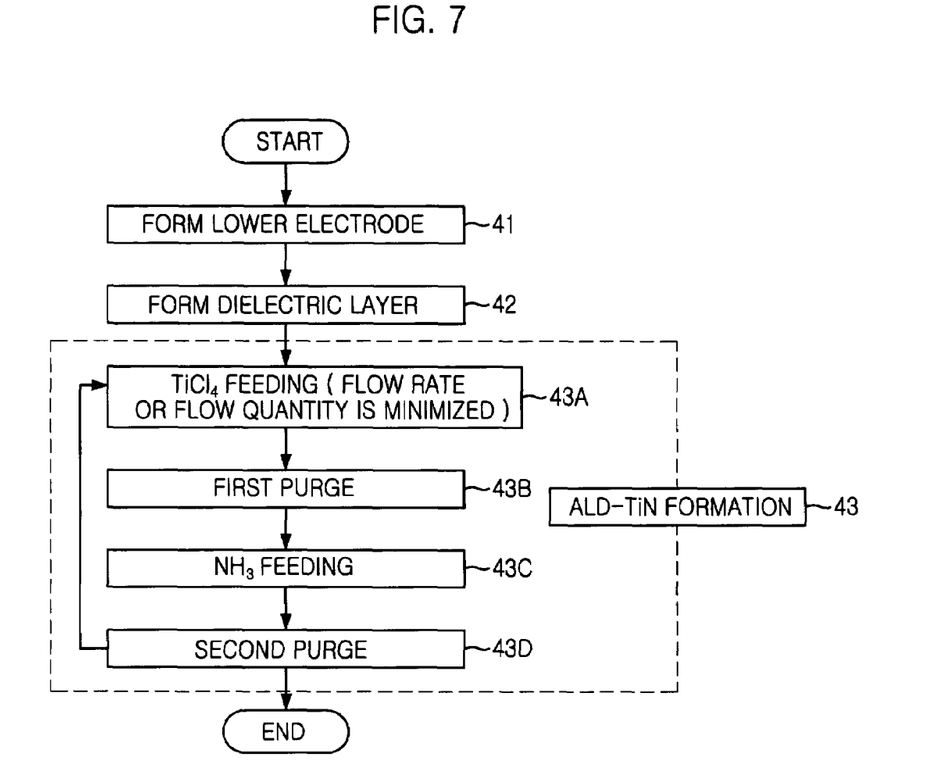
FIG. 7 is a flowchart explaining each step of a method for fabricating a capacitor in accordance with a second preferred embodiment of the present invention.

FIG. 7 illustrates a flowchart for describing a capacitor fabrication method in accordance with a second preferred embodiment.

Referring to FIG. 7, a lower electrode formation process 41, a dielectric layer formation process 42, and an ALD-TiN layer formation process 43 are performed. Continuously, the ALD-TiN layer formation process 43 including a TiCl$_4$ feeding process 43A, the first purge process 43B, a NH$_3$ feeding process 43C, and the second purge process 43D is performed, wherein one cycle consists of the TiCl$_4$ feeding process 43A, the first purging process 43B, the NH$_3$ feeding process 43C, and the second purging process 43D.

As shown in FIG. 7, during the TiCl$_4$ feeding process 43A of the ALD-TiN layer formation 43, the TiCl$_4$ flow rate or the TiCl$_4$ flow quantity is minimized until forming at least one ALD-TiN monolayer in order to reduce a loss of the dielectric layer. Herein, the TiCl$_4$ flow quantity is minimized by opening an open value manually.

For the minimum level of the TiCl$_4$ flow rate or quantity, the TiCl$_4$ gas is by-passed in a moment less than 0.1 seconds outside of the chamber by opening a feeding value during the second purge process 43D and flown into the chamber again when the TiCl$_4$ feeding process is carried out. Consequently, the flow rate and flow quantity are minimized through a series of steps mentioned above.

Figure 8:
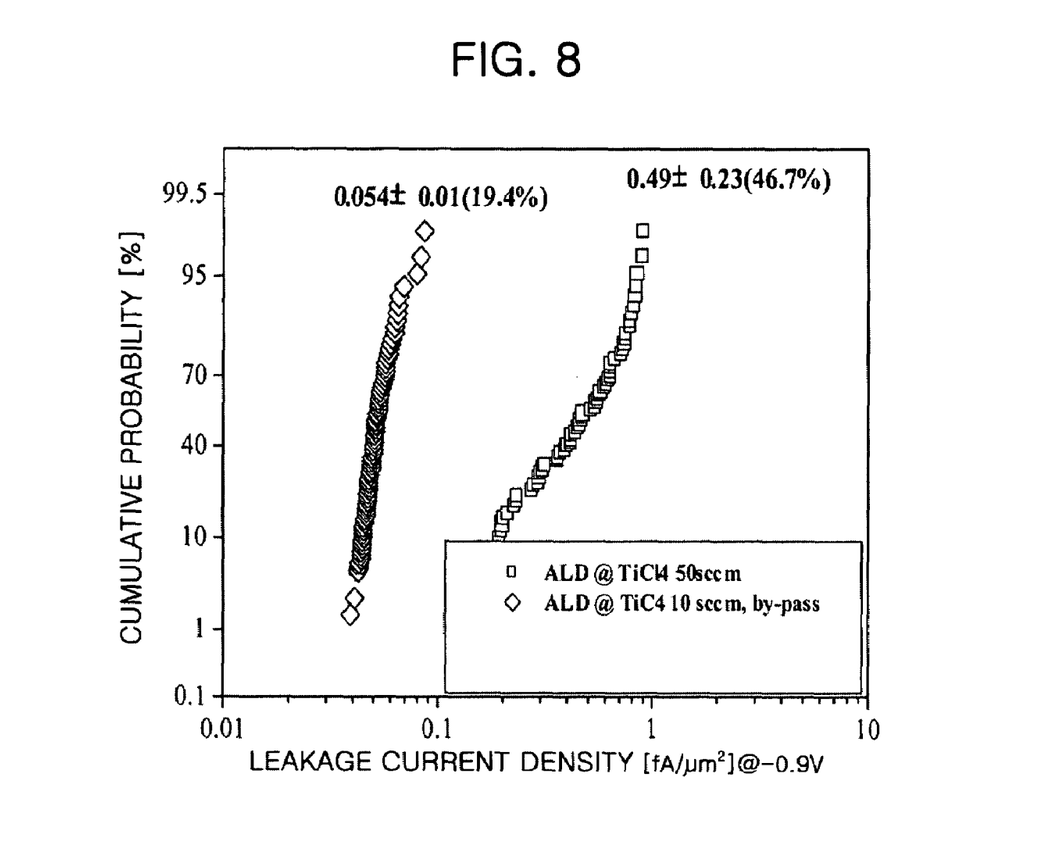
FIG. 8 is a diagram showing a leakage current density obtained by reducing a flow rate of $TiCL_4$ and by-passing it.

FIG. 8 shows leakage current density values resulting from reducing the TiCl$_4$ flow rate and by-passing the TiCl$_4$ gas. AMAT and TEL are names of the equipment.

Furthermore, only initial twenty cycles are used while the TiCl$_4$ gas is by-passed, because a step coverage is affected by reducing the TiCl$_4$ and an used amount of the TiCl$_4$ is increased by by-passing the TiCl$_4$ gas, wherein the initial twenty cycles is enough to form a monolayer of TiN.

According to FIG. 8, a leakage current density obtained by applying the TiCl$_4$ flow rate of about 10 sccm and by-passing the TiCl$_4$ rapidly is lower than another leakage current density obtained by applying the TiCl$_4$ flow rate of about 50 sccm. That is, the leakage current density is reduced from approximately 0.49±0.23 fA/$\mu$m$^2$ to approximately 0.054±0.01 fA/$\mu$m$^2$.

Usually, the TiCl$_4$ flow rate is fixed at about 10 sccm to about 50 sccm.

Figure 9:
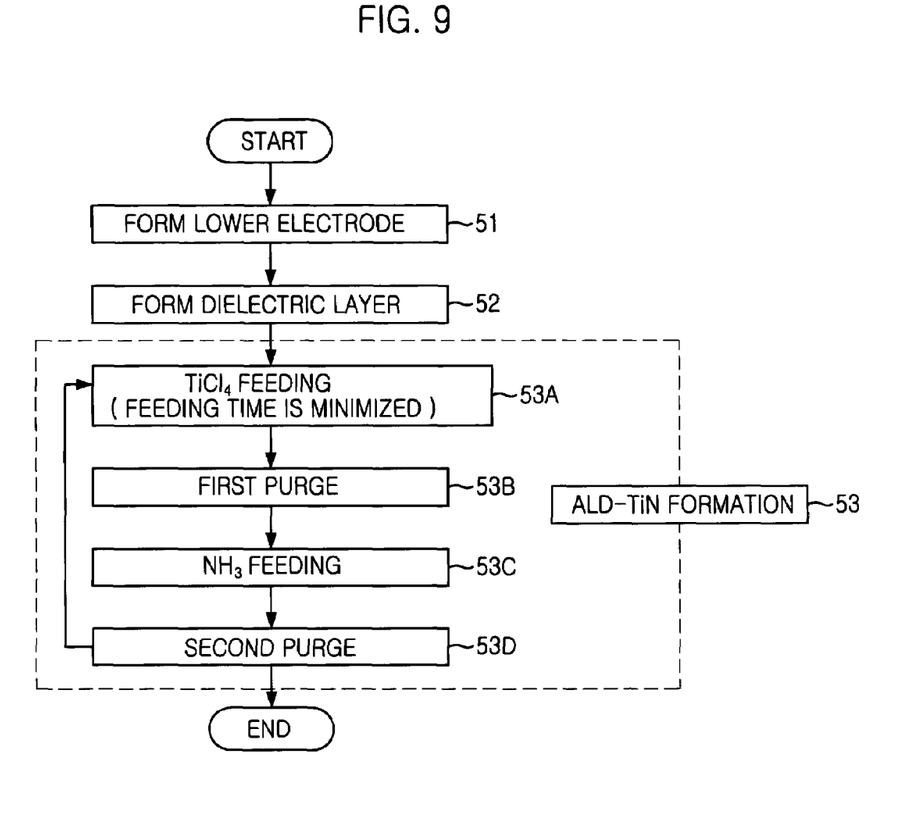
FIG. 9 is a flowchart explaining each step of a method for fabricating a capacitor in accordance with a third preferred embodiment of the present invention.

FIG. 9 illustrates a flowchart for describing a capacitor fabrication method in accordance with a third embodiment.

As shown in FIG. 9, a lower electrode formation, a dielectric layer formation, and an ALD-TiN layer formation are carried out in order. The ALD-TiN layer formation process includes a TiCl$_4$ feeding process 53A, the first purge process 53B, NH$_3$ feeding process 53C, and the second purge process 53D, wherein one cycle consists of the TiCl$_4$ feeding process 53A, the first purge process 53B, NH$_3$ feeding process 53A, and the second purge process 53D. Consequently the ALD-TiN layer is formed after this lapse of one cycle.

FIG. 9 shows the ALD-TiN layer formation process, wherein the TiCl$_4$ feeding time is minimized to prevent the dielectric layer from being repeatedly exposed by the TiCl$_4$ gas. As a result of this minimization, a loss of the dielectric layer is reduced.

Figure 10:
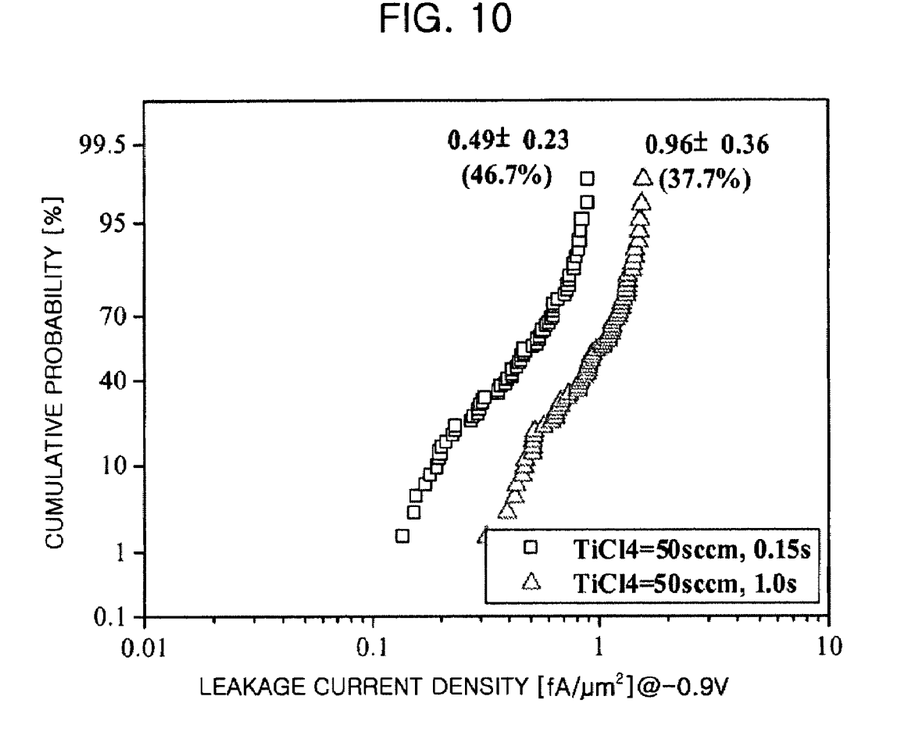
FIG. 10 is a diagram illustrating a leakage current density in case of reducing a feeding time of $TiCL_4$.

FIG. 10 shows a leakage current density obtained by reducing the TiCl$_4$ feeding time. According to FIG. 10, the TiCl$_4$ feeding time is reduced from about 1 second to about 0.15 seconds. At this time, the TiCl$_4$ flow rate is approximately 50 sccm, and the NH$_3$ flow rate and feeding time are about 1000 sccm and 0.45 seconds, respectively. Also, during the first and second purge processes, an argon (Ar) flow rate and feeding rate are about 800 sccm and 0.15 seconds, respectively. The deposition temperature is maintained constantly at about 470 °C.

Referring to FIG. 10, the leakage current density is reduced from about 0.96±0.36 fA/$\mu$m$^2$ to about 0.49±0.23 fA/$\mu$m$^2$ as the TiCl$_4$ feeding time is reduced from about 1 second to about 0.15 seconds.

Desirably, the TiCl4 feeding time has to be timed, wherein initial 50 cycles lapse for about 0.05 seconds to about 0.2 seconds and the rest lapses for about 0.5 seconds to about 0.2 seconds.

Figure 11A:
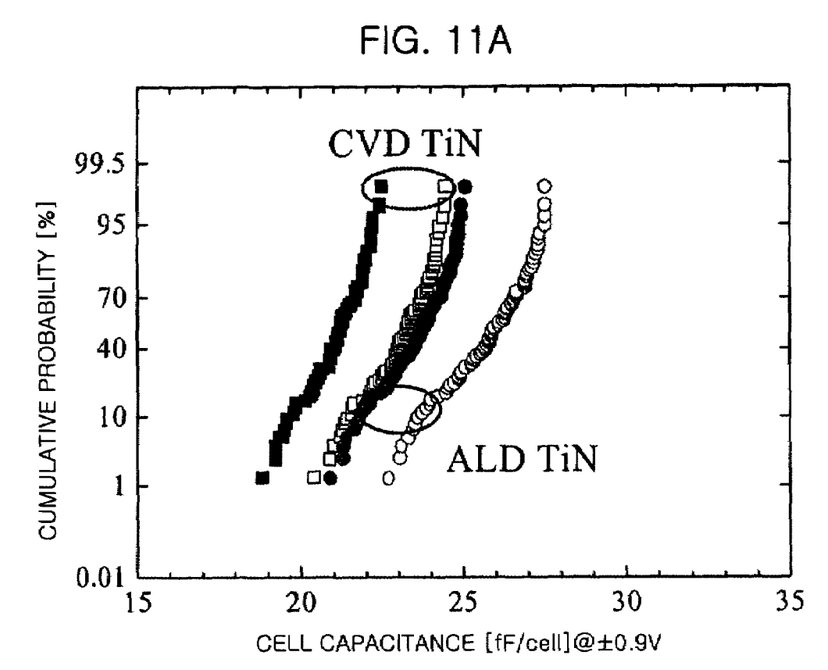
FIG. 11A is a diagram showing a comparison between a cell capacitance of a capacitor obtained through the use of a CVD-TiN and a cell capacitance of another capacitor obtained through the use of a ALD-TiN.
Figure 11B:
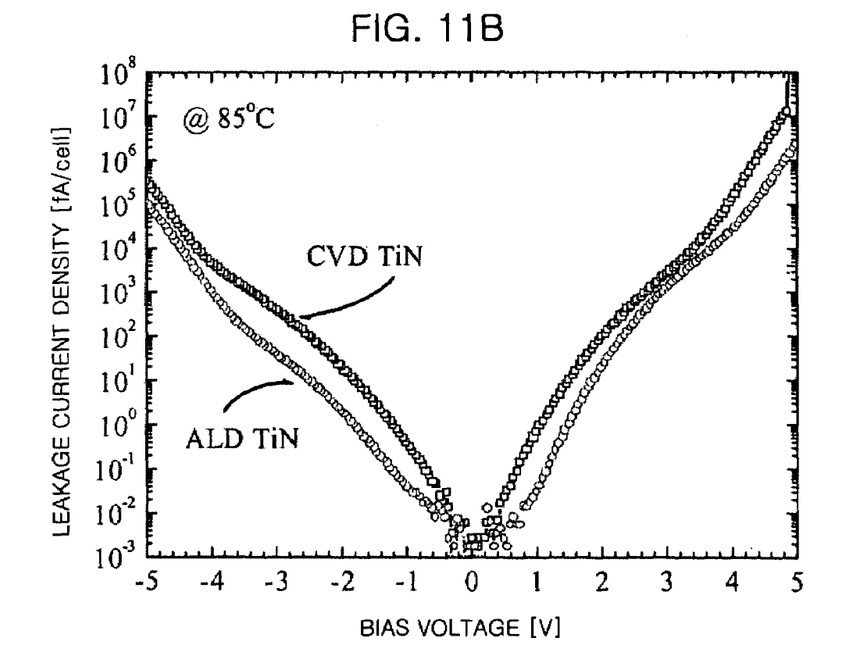
FIG. 11B is a diagram showing a comparison between a leakage current density obtained by using a CVD-TiN and a leakage current density obtained by using an ALD-TiN.

FIG. 11A is a diagram showing a comparison of a cell capacitance of a capacitor using the ALD-TiN layer with that of another capacitor using a CVD-Tin layer. FIG. 11B shows a comparison of a leakage current density obtained by using the ALD-TiN with another leakage current density obtained through using the CVD-TiN. Especially, results of these cases are different due to their different processing procedures, wherein the cell capacitance and leakage current density obtained by using the ALD-TiN layer result from reducing the TiCl$_4$ flow rate and by-passing the TiCl$_4$ gas rapidly.

According to FIG. 11A, it is shown that the cell capacitance obtained by using the ALD-TiN layer is improved compared with the cell capacitance obtained by using the ALD-TiN layer.

In addition, it is also shown that the leakage current density obtained by using the ALD-TiN layer is decreased compared with the leakage current density obtained by using the CVD-TiN layer. In more detail, compared with the result according to FIG. 6B, the leakage current density is improved much more than 10 times.

In the above preferred embodiments already mentioned, TaO is used as the dielectric layer of the capacitor. It is also possible to use one of such materials as Al$_2$O$_3$, TiO$_2$, HfO$_2$, Ta$_2$O$_5$, ZrO$_2$, (Ba, Sr)TiO$_3$, Pb(Zr, Ti)O$_3$, and (Pb, La) (Zr, Ti)O$_3$ as the dielectric layer.

In addition, the oxide materials mentioned above can be applied to most types of capacitor having the following structures; they are a stacking structure, a cylinder structure, a concave structure, a MIS structure, and a MIM structure. Particularly, the capacitor having the above structures uses the ALD-TiN layer as the upper and lower electrode. It is still possible to apply the oxide materials to most types of DRAM and FeRAM using oxides layers as a dielectric layer and using the ALD-TiN as an upper and a lower electrode.

What is claimed is:

1. A method for fabricating a capacitor, comprising the steps of:

a) forming a lower electrode on a semiconductor substrate;

b) forming a dielectric layer on the lower electrode;
c) loading the semiconductor substrate containing the dielectric layer into a deposition chamber;
d) nitriding a surface of the dielectric layer while $NH_3$ gas is flowed into the deposition chamber; and
e) forming an upper layer by using a source gas $NH_3$, containing Titanium (Ti) on the nitrated surface of the dielectric layer through an atomic layer deposition (ALD) method.

2. The method as recited in claim 1, wherein the step d) is performed on condition that the source gas $NH_3$ is flowed in at a flow rate of about 300 sccm to about 1000 sccm for about 10 seconds to about 120 seconds.

3. The method as recited in claim 1, wherein the upper layer includes a TiN layer formed by the ALD method using $TiCl_4$ gas as a precursor.

* * * * *